United States Patent [19]
Viswanath et al.

[11] Patent Number: 6,019,166
[45] Date of Patent: Feb. 1, 2000

[54] PICKUP CHUCK WITH AN INTEGRAL HEATSINK

[75] Inventors: Ram S. Viswanath, Phoenix; Philip R. Martin, Tempe, both of Ariz.

[73] Assignee: Intel Corporation, Santa Clara, Calif.

[21] Appl. No.: 09/000,981

[22] Filed: Dec. 30, 1997

[51] Int. Cl.[7] .................................................. F28F 7/00
[52] U.S. Cl. ...................... 165/80.4; 165/80.2; 165/80.3; 165/104.33; 118/724; 118/728; 219/497
[58] Field of Search ................... 165/80.2, 80.3, 165/80.4; 118/724, 728; 219/497

[56] References Cited

U.S. PATENT DOCUMENTS

| | | | |
|---|---|---|---|
| 3,993,123 | 11/1976 | Chu et al. .............................. | 165/80.3 |
| 4,273,185 | 6/1981 | Thoma et al. ........................... | 165/80.3 |
| 4,483,389 | 11/1984 | Balderes et al. ........................ | 165/80.3 |
| 4,753,287 | 6/1988 | Horne ..................................... | 165/80.3 |
| 5,220,956 | 6/1993 | Noble, Jr. et al. ...................... | 165/80.2 |
| 5,297,006 | 3/1994 | Mizukoshi .............................. | 165/80.3 |
| 5,297,618 | 3/1994 | Behun et al. ........................... | 165/80.3 |
| 5,515,912 | 5/1996 | Daikoku et al. ........................ | 165/80.2 |
| 5,735,340 | 4/1998 | Mira et al. .............................. | 165/80.3 |
| 5,775,416 | 7/1998 | Heimanson et al. .................... | 165/80.2 |
| 5,847,366 | 12/1998 | Grunfeld ................................. | 165/80.4 |

*Primary Examiner*—Ira S. Lazarus
*Assistant Examiner*—Terrell McKinnon
*Attorney, Agent, or Firm*—Blakely, Sokoloff, Taylor & Zafman LLP

[57] ABSTRACT

A pickup chuck having a heat slug for removing heat from a heat generating device that is held within the pickup chuck.

14 Claims, 4 Drawing Sheets

PICKUP CHUCK WITH AN INTEGRAL HEATSINK

FIELD OF THE INVENTION

The present invention relates generally to testing of semiconductor devices and, more specifically, to a pickup chuck which is used for purposes of testing semiconductor devices.

BACKGROUND OF THE INVENTION

Integrated circuits are typically housed within a package that is mounted to a printed circuit board (PCB). The package is designed to protect the integrated circuit device from damage, to provide adequate heat dissipation during operation, and to provide electrical connection between the integrated circuit device and a PCB (e.g., a peripheral card, a motherboard and the like). These conventional packages may include a variety of packages such as pin grid array (PGA), land grid array (LGA), ball grid array (BGA), column grid array (CGA), and other packages. FIG. 1 illustrates a conventional LGA package. Package 100 includes an integrated circuit device 102 that is electrically coupled to the package substrate 104 by a plurality of solder bumps 106. Lands 108, on the bottom surface of the package, are used to electrically couple the package to a corresponding set of lands on a PCB.

As a part of the manufacturing process, integrated circuits typically undergo a variety of functional tests. The present invention is aimed at removing heat from the surface of an integrated circuit that is housed within a package during the functional testing of the integrated circuit device. The functional test is performed before a package is mounted to a printed circuit board. The purpose of the test is to check the functionality and to monitor the electrical performance of the integrated circuit. The environmental test is generally performed within a temperature controlled chamber. A vacuum pickup chuck is typically used to position the package within the chamber. The electrically testing of the integrated circuit is performed by positioning the package within the chamber such that the package contacts are in electrical contact with a corresponding set pogo pins or contact array located on the contactor/load board of the test apparatus. Information pertaining to the electrical performance of the device is gathered during the test. The information is then used to screen out the bad integrated circuits and to classify the integrated circuits according to their operating frequency. This process is commonly referred to as "binning out."

It is commonly known that as the temperature of an integrated circuit rises, the frequency at which the device operates decreases. Therefore, it is important to control the temperature of the integrated circuit during the functional test to ensure that the device is appropriately classified or "binned" according to its operating frequency. It is also important to control the temperature of the integrated circuit since excessive temperatures may affect the performance of the circuit and cause permanent degradation of the device. In addition, it is desirable to hold the temperature of the integrated circuit device at a relatively constant temperature throughout the testing sequence.

The traditional method for cooling integrated devices has been through convection heat transfer. Using this method, heat is dissipated from the integrated circuit through the outer surfaces of the device into still or moving air. As the integration level (i.e., the number of transistors per device) of integrated circuits increases, or the power requirements or the operating speed of integrated circuits increases, the amount of heat generated by these devices increases to a point where conventional convection based solutions are inadequate. Although "active" heat removal methods, such as heat pumps and heat pipe systems, have been developed to cool these high heat dissipating devices within their normal operating environments, there exists a need to provide a method for cooling the integrated circuits during the functional testing of the devices. If the integrated circuit device is not adequately cooled during the test, and is permitted to rise significantly above a designated test temperature, the device may be unnecessarily down-graded into a lower frequency bin. It is also important that the temperature of the integrated circuit device be maintained above the designated test temperature during the functional test sequence in order to ensure that the device is not improperly upgraded into a higher frequency bin.

Thus, what is needed is a method and apparatus for controlling the temperature of an integrated circuit device that solves the problems associated with testing an integrated circuit package.

SUMMARY OF THE INVENTION

The invention provides a pickup chuck which includes a heat slug for removing heat from a heat generating device that is held within the pickup chuck.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus for removing heat from an electronic device is described. In the following description, numerous specific details are set forth in order to provide a thorough understanding of the invention. However, it will be obvious to one of skill in the art that the invention may be practiced without these specific details. In other instances, well known elements have not been shown in particular detail in order to avoid unnecessarily obscuring the present invention. It is important to note that this discussion will mainly be limited to those needs associated with controlling the temperature of an integrated circuit device under test. It will be recognized, however, that such focus is for descriptive purposes only and that the apparatus of the present invention may be applied to other applications.

As previously discussed, many modern semiconductor devices and device packaging have evolved to a point where convection heat transfer alone is unable to provide adequate cooling to the devices during the performance and functionality test of such devices. In accordance with the present invention a pickup chuck having an integral heat slug is provided which facilitates the removal of heat from the backside of an integrated circuit device under test.

Figure 1:
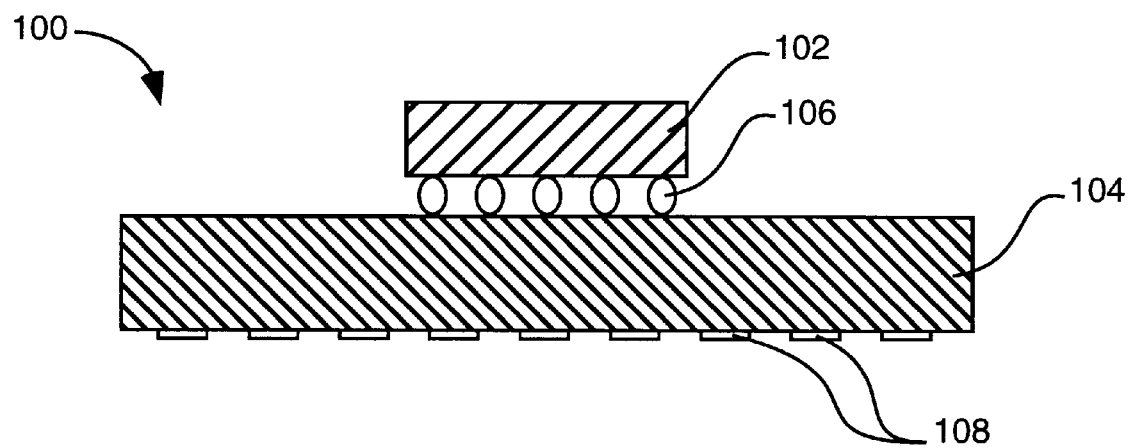
FIG. 1 is a side view of a conventional semiconductor chip package.
Figure 2A:
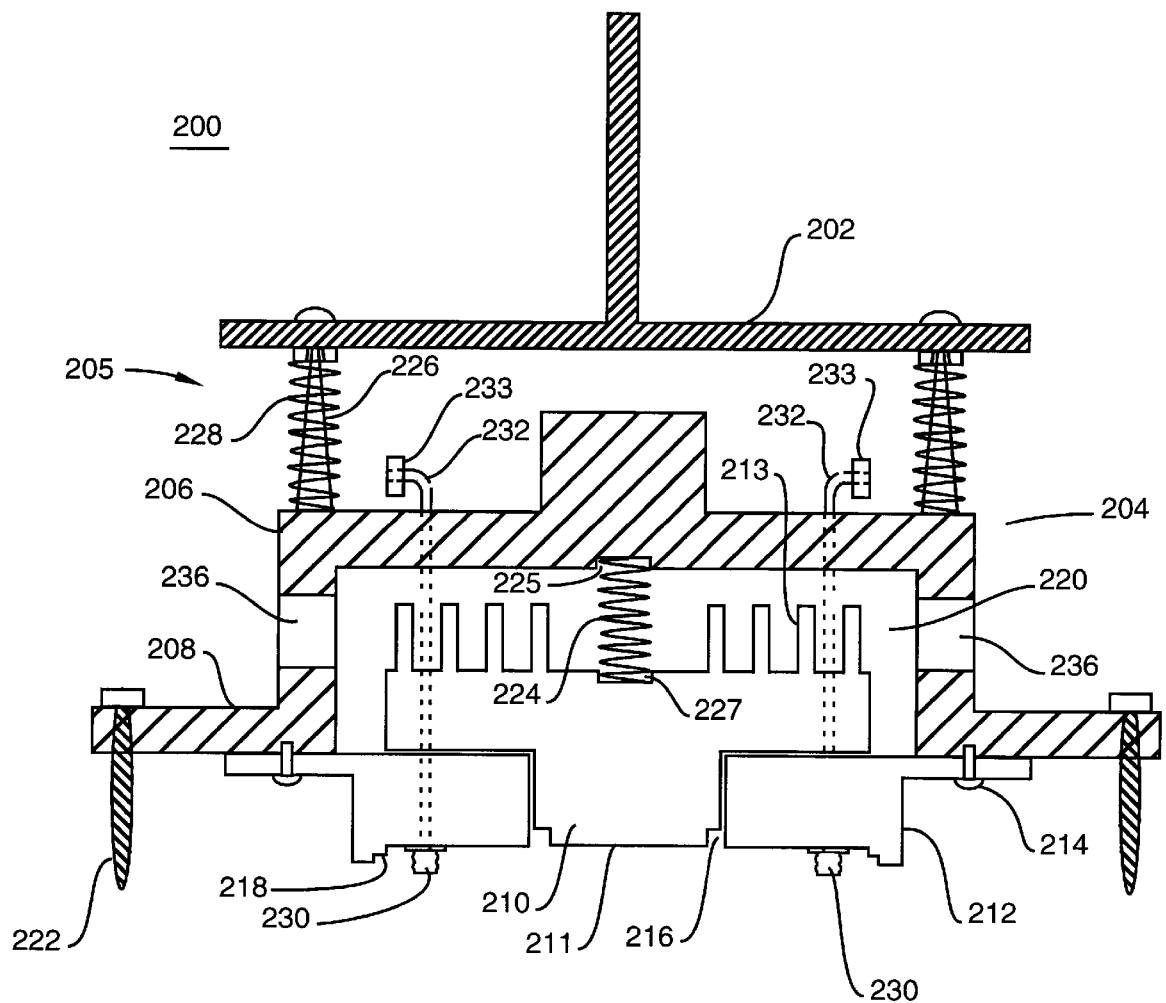
FIG. 2A is a side view of a pickup chuck in one embodiment of the present invention.

FIG. 2A illustrates a pickup chuck 200 according to one embodiment of the present invention. Pickup chuck 200 includes a mounting structure 202, a body 204, and a connector set 205 which pivotally mounts the body 204 to the mounting structure 202. The connector set 205 comprises tapered pins 226 connecting the body 204 to the mounting structure 202 and springs 228 that are located around the pins 226. Springs 228 operate to restore the body 204 to a neutral position relatively to the mounting structure 202.

Body 204 includes a center portion 206 and a flange section 208 that extends radially from the center portion 206. A heat slug 210 is movably mounted in a recess 220 that is formed between body 204 and a lower body member 212. Member 212 includes a through opening 216 for receiving a portion of heat slug 210 and is attached to body 204 by threaded fasteners 214. Lower member 212 also includes a nest region 218 for receiving a semiconductor package. A spring 224, or other biasing element, is positioned within recess 220 to urge heat slug 210 in a direction away from body 204. Spring 224 is compressed between a spring seat 225 of center portion 206 and a spring seat 227 in heat slug 210 so that the heat slug 210 is continuously biased in a direction out of the body 204. Heat slug 210 has a contact surface 211 which can be depressed thus resulting in compression of the spring 224 and movement of the heat slug 210 in a direction which is into the body 204. Fins 213 are provided on the top surface of heat slug 210 to maximize the heat transfer surface area of the heat slug. Passages 236 are provided within body 204 for directing fluid flow over fins 213. By providing a forced fluid flow across fins 213, the ability of the heat slug to dissipate heat from an integrated circuit device is enhanced as a result of an increase in the convection heat transfer.

A plurality of axially retractable vacuum cups 230 are provided along the bottom of member 212. Preferably, vacuum cups 230 are formed of a resilient material, and may include a bellows portion which facilitates the retraction of the vacuum cups. Vacuum channels 232 are coupled in use to an exterior vacuum source via fittings 233. When the upper flat surface of semiconductor package 100 is placed into close proximity with vacuum cups 230, the exterior vacuum source will evacuate air from the package surface and cause a negative pressure upon the package to be exerted thereby serving to hold the package within the nest 218 of chuck 200. The negative pressure exerted upon the package is sufficient to collapse vacuum cups 230 drawing the package toward the bottom surface of nest 218. An ambient or positive pressure within channels 232 causes the semiconductor package to be released from the pickup chuck 200.

Figure 3:
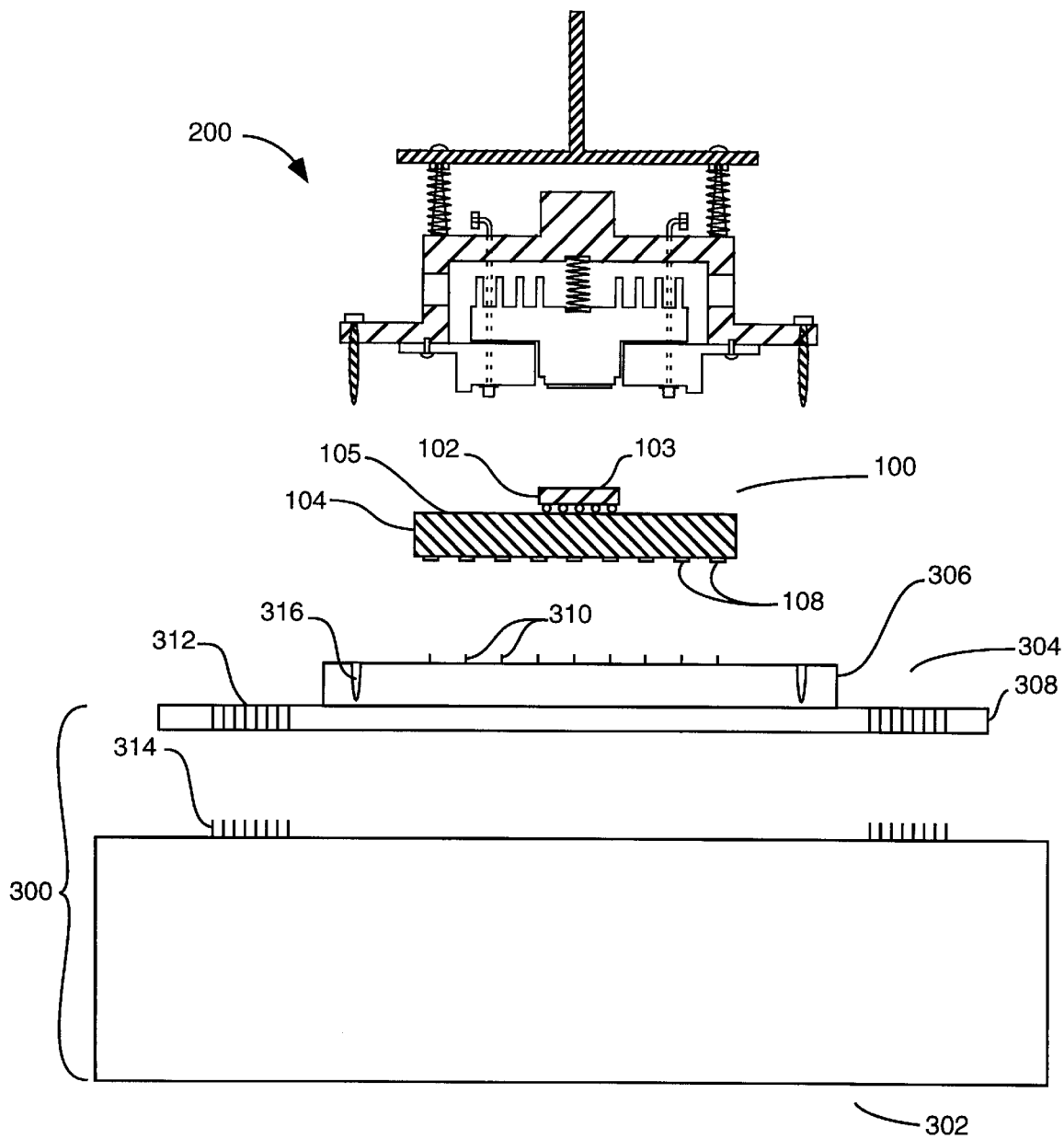
FIG. 3 is a sectioned side view of a test unit in combination with a pickup chuck, according to one embodiment of the present invention.

With reference to FIG. 3, pickup chuck 200 is positioned to retrieve semiconductor package 100 so that when a negative pressure is applied to vacuum cups 230, the semiconductor package 100 is retained on the pickup chuck. Prior to retrieving package 100, the contact surface 211 of heat slug 210 is aligned with a backside surface 103 of integrated circuit device 102. As illustrated in FIG. 3, the shape of contact surface 211 generally conforms to the surface shape of device 102. As pickup chuck 200 is lowered into position to retrieve package 100, the contact surface 211 of heat slug 210 initially makes contact with the backside surface 103 of device 102. Pickup chuck 200 is further lowered so that vacuum cups 230 contact the top-side surface 105 of package substrate 104. This causes the heat slug 210 to be moved in a direction into body 204. The spring constant of spring 224 is selected so that the compressive force acting on the surface 103 of integrated circuit device 102 provides adequately low thermal resistance and will not crush, or otherwise damage, the integrated circuit device.

The manner in which heat slug 210 is mounted to body 204, in combination with the pivotal arrangement of mounting structure 202 and body 204, provides the pickup chuck 200 with a self-planarization feature. This feature enhances the heat transfer capability of the apparatus by maximizing the contact surface area between heat slug 210 and integrated circuit device 102. By maximizing the contact surface area between heat slug 210 and device 102, the conductive heat transfer between the two components is also maximized. Additionally, this feature ensures that a good surface contact is achieved between heat slug 210 and device 102 even when the planarity of the semiconductor package is skewed. Heat generated during testing of integrated circuit device 102 is thus conductively transferred from the backside surface 103 of device 102 to heat slug 210 and then conductively from the heat slug 210 to the surrounding air.

Figure 2B:
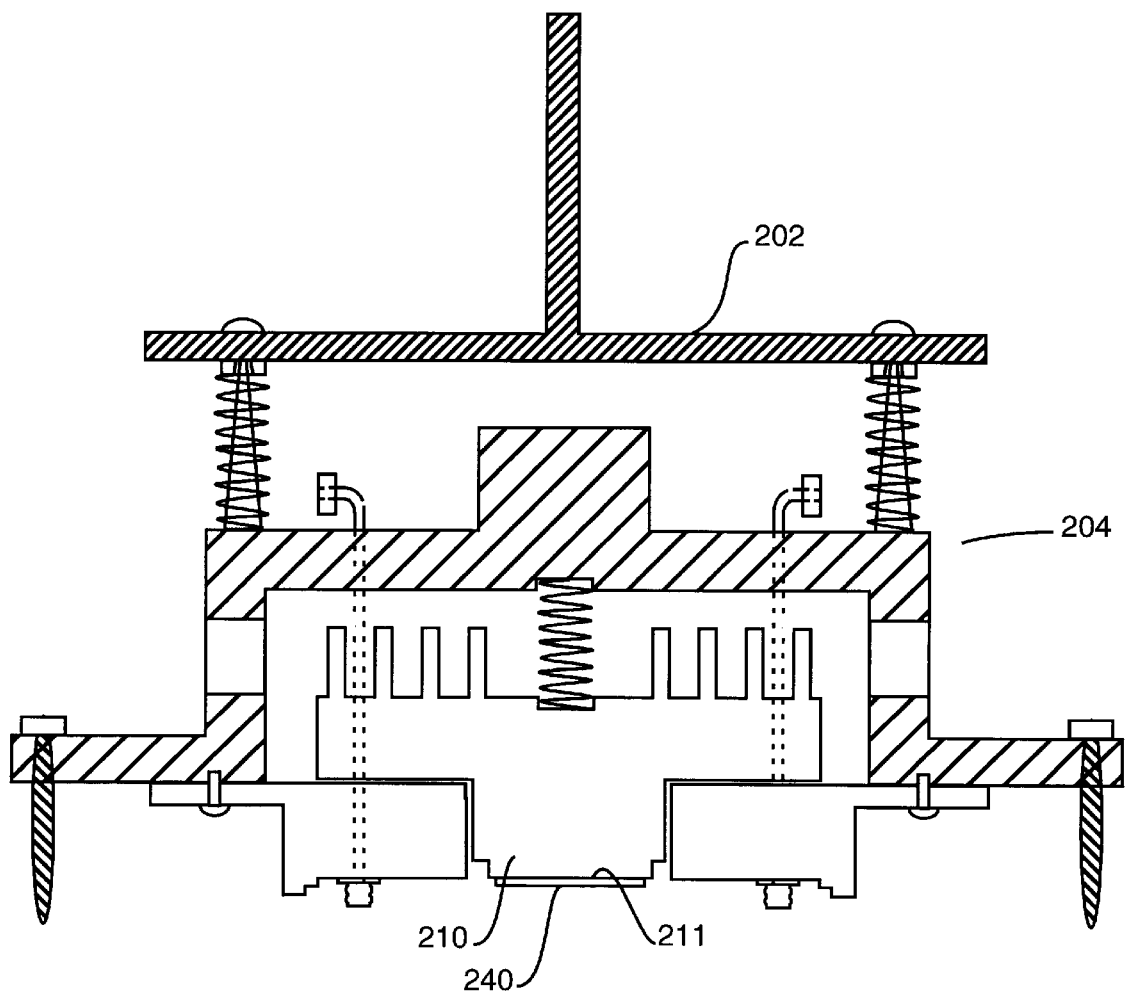
FIG. 2B is a side view of a pickup chuck in another embodiment of the present invention.

In accordance with one embodiment of the invention, a compliant and thermally conductive material 240 is provided along the contact surface 211 of heat slug 210 as shown in FIG. 2B. Compliant material 240 helps to maximize the contact surface area between the pickup chuck 200 and integrated circuit device 102. The compliant material 240 also acts to cushion the backside surface of device 102 from the hard contact surface 211 of heat slug 210, thereby reducing the likelihood that the integrated circuit device 102 will be damaged during the retrieval, transporting, and testing of the integrated circuit device.

Heat slug 210 provides pickup chuck 200 with a thermal mass for absorbing heat that is generated by integrated circuit device 102 while the device is being tested. Heat slug 210 comprises a material having a high thermal conductivity and a high thermal capacitance. For example, in one embodiment, heat slug 210 comprises copper. The heat slug may contain an inert plating such as nickel along contact surface 211 for wear resistance.

In one embodiment of the present invention, pickup chuck 200 is fully contained within a temperature controlled environmental chamber. By containing the integrated circuit package 100 and pickup chuck completely within a constant temperature environmental chamber, it is ensured that the integrated circuit device is maintained above a certain minimum temperature during the test sequence.

With continuing reference to FIG. 3, a test apparatus 300 for testing the semiconductor package 100 and integrated circuit device 102 is illustrated. A test head 302 and a tester interface unit (TIU) 304 is shown. The test head 302 represents a portion of a test unit that is used to generate a series of test signals to test the performance of semiconductor package 100 and integrated circuit device 102. The TIU 304 includes a test contactor 306 having an array of pogo pins 310, or other contact formations, located along the top surface of the contactor so as to contact the lands 108 of package 100. Contactor 306 is electrically coupled to a substrate 308 having an electrical network (not shown) for coupling the pogo pins 310 of contactor 306 to pins 314 located on the face of test head 302. A set of pin connections 312 are provided within contactor substrate 308 for receiving the pins 314 of test head 302. The TIU 304, thus provides an interface that enables semiconductor package 100 to be electrically coupled to test head 302. It is appreciated that the present invention is not limited to any particular type of test contactor. For example, semiconductor package 100 may comprise a pin grid array (PGA). In such an instance, a socket connection is provided within contactor 306 to receive the pins of the PGA package.

Contactor 306 includes a set of apertures 316 for receiving a set of alignment pins 222 that are mounted to the body 204 of pickup chuck 200.

Testing of the integrated circuit 102 is achieved by placing the lands 108 of package 100 into contact with the pogo pins 310 of contactor 306. Once electrical contact with contactor 306 and semiconductor package 100 is achieved, integrated circuit 102 may be tested in accordance with any number of testing methods and sequences. In any event, testing typically involves the coupling of device 102 to a voltage source and some mode of circuit operation. This, in turn, results in the generation of heat which must be dissipated from the integrated circuit device in order to conform to applicable test requirements and/or to maintain the temperature of the device within safe operating limits. In accordance with the present invention, package 100 is positioned and held in electrical contact with contactor 306 by pickup chuck 200. The heat generated in device 102 is transferred away to heat slug 210.

It is known that exposed silicon dice are generally susceptible to cracking at or near the edges of the dice where stress concentration and the possibility of mechanical damage are at their highest. Cracks formed along the edges tend to propagate through the device and may ultimately result in a device failure when subjected to thermal/mechanical stresses. It is therefore desirable to minimize any external contact with the edges of the integrated circuit during the manufacture and testing of the devices. In one embodiment of the present invention, heat slug 210 comprises a stepped configuration wherein the contact surface 211 has a reduced surface area. Hence, in accordance with one implementation of the present invention, the contact surface 211 of heat slug 210 is sized to be smaller than the backside surface 103 of integrated circuit device 102. (See FIG. 3.) Thus, when the contact surface 211 of heat slug 210 is brought into contact with the backside surface 103 of the integrated circuit device 102, the heat slug 210 does not contact the edges of the device 102.

Thus, a pickup chuck and a contactor in combination with the pickup chuck have been described. Although the present invention has been described with reference to specific exemplary embodiments, it will be evident that various modifications and changes may be made to these embodiments without departing from the broader spirit and scope of the invention. It is also important to note that the present invention is not limited to the testing of integrated circuits housed within an LGA package. The invention may be used to test integrated circuit devices housed within BGA, PGA, and other integrated circuit packages. Moreover, it is appreciated that the present invention may be used to remove heat from other electronic or electrical devices. Accordingly, the specifications and drawings are to be regarded in an illustrative rather than a restrictive sense.

What is claimed:

1. A pickup chuck for retaining a heat generating device having a first surface, said pickup chuck comprising:

a body defining passages for fluid;

a heat slug coupled to said body, said heat slug being movable in a first direction that is away from said body and a second direction that is toward said body, said heat slug having a second surface for contacting said first surface of said heat generating device, said heat slug including fins;

a fluid flow path in said body for directing a fluid flow across at least a portion of said fins, said fluid flow path being in fluid communication with said passages;

retaining means for retaining said heat generating device in contact with said heat slug; and biasing means urging said heat slug away from said body.

2. The pickup chuck of claim 1 wherein a compliant and thermally conductive material is disposed over said second surface.

3. The pickup chuck of claim 1 wherein said retaining means includes at least one suction pad;

a conduit extending through at least a portion of said body, said suction pad coupled to said conduit; and a connector for coupling said suction pad to a vacuum source.

4. The pickup chuck of claim 1 wherein said biasing means comprises at least one spring that is compressed between a surface of said body and a surface of said heat slug.

5. The pickup chuck of claim 1 wherein the surface area of said second surface is smaller than the surface area of said first surface.

6. The pickup chuck of claim 1 wherein said fluid is air.

7. A contactor in combination with a pickup chuck the contactor comprising:

a first body with a surface having a set of electrical contacts thereon; and the pickup chuck comprising:

a second body defining passages for fluid;

a heat slug coupled to said second body, said heat slug being movable in a first direction that is away from said second body and a second direction that is toward said second body, said heat slug having a contact surface for contacting a surface of an heat generating device, said heat slug including fins;

a fluid flow path in said body for directing a fluid flow across at least a portion of said fins, said fluid flow path being in fluid communication with said passages;

retaining means for retaining said heat generating device in contact with said heat slug; and biasing means urging said heat slug away from said second body;

said first and second bodies having complementary formations for aligning said contactor with said pickup chuck.

8. The pickup chuck of claim 7 wherein the surface area of said heat slug contact surface is smaller than the surface area of said heat generating device.

9. The pickup chuck of claim 7 wherein said retaining means includes at least one suction pad;

a conduit extending through at least a portion of said second body, said suction pad coupled to said conduit; and a connector for coupling said suction pad to a vacuum source.

10. The pickup chuck of claim 7 wherein said biasing means comprises at least one spring that is compressed between a surface of said second body and a surface of said heat slug.

11. The pickup chuck of claim 7 wherein said fluid is air.

12. A pickup chuck for retaining a heat generating device having a first surface, said pickup chuck comprising:

a body defining passages for directing an air flow;

a heat slug coupled to said body, said heat slug being movable in a first direction that is away from said body and a second direction that is toward said body, said heat slug having a second surface for contacting said first surface of said heat generating device;

a fluid flow path in communication with said passages for directing said air flow across at least a portion of said heat slug;

at least one suction pad on said body for retaining said heat generating device in contact with said heat slug;

a conduit extending through at least a portion of said body, said suction pad coupled to said conduit;

a connector cooperating with said conduit for coupling said suction pad to a vacuum source; and at least one spring urging said heat slug away from said body, said spring compressed between a surface of said body and a surface of said heat slug.

13. The pickup chuck of claim 12 wherein said heat slug includes fins and wherein said fluid flow path directs said air flow across at least a portion of said fins.

14. The pickup chuck of claim 12 further comprising a contactor having a second body with a surface having a set of electrical contacts thereon, wherein said first and second bodies have complimentary formations for aligning said contactor with said first body.

* * * * *